United States Patent
Wang et al.

(10) Patent No.: US 6,849,474 B2
(45) Date of Patent: Feb. 1, 2005

(54) GROWING A LOW DEFECT GALLIUM NITRIDE BASED SEMICONDUCTOR

(75) Inventors: Shih-Yuan Wang, Palo Alto, CA (US); Yong Chen, Mountain View, CA (US)

(73) Assignee: Lumileds Lighting U.S., LLC, San Jose, CA (US)

(*) Notice: Subject to any disclaimer, the term of this patent is extended or adjusted under 35 U.S.C. 154(b) by 290 days.

(21) Appl. No.: 10/047,504

(22) Filed: Oct. 26, 2001

(65) Prior Publication Data

US 2002/0075925 A1 Jun. 20, 2002

Related U.S. Application Data

(63) Continuation of application No. 09/263,654, filed on Mar. 5, 1999, now Pat. No. 6,327,288.

(51) Int. Cl.[7] .......................... H01L 21/00; H01L 21/20
(52) U.S. Cl. ........................................ 438/31; 438/481
(58) Field of Search ........................... 438/31, 46, 481, 438/483

(56) References Cited

U.S. PATENT DOCUMENTS 6,153,010 A    11/2000    Kiyoku et al. ................. 117/95

FOREIGN PATENT DOCUMENTS

| EP | 0 627 799 A1 | 12/1994 | ............. H01S/3/19 |
| EP | 0 851 542 A2 | 7/1998 | ............. H01S/3/00 |
| JP | 60235485 | 11/1986 | ............. H01S/3/18 |
| JP | 62212187 | 9/1987 | ............. H01S/3/18 |
| JP | 04127521 | 4/1992 | ........... H01L/21/20 |

OTHER PUBLICATIONS

Zheleva, Tsvetanka, et al. "Pendeo–Epitaxy—A New Approach for Lateral Growth of Gallium Nitride Structures", Proceedings of the Symposium GaN and related Alloys, Boston, Nov. 30–Dec.

Nakamura, Shuji, "InGaN Multiquantum = Wheel–Structure Laser Diodes with GaN–AlGaN Modulation–Doped Strained–Layer Superlattices", IEEE Journal of Selected Topics in Quantum Electronics, vol. 4, No. 1, May/Jun. 1998, pp. 483–489.

Nakamura, Shuji, "Violet InGaN/GaN–Based Laser Diodes Operable at 50 Degrees C with a Fundimental Tansverse Mode", Japan Journal Applied Physics. vol. 38, 1999, pp. L226–229.

Primary Examiner—W. David Coleman
(74) Attorney, Agent, or Firm—Patent Law Group LL

(57) ABSTRACT

A low defect gallium nitride based semiconductor, and method for its production, is disclosed. A first gallium nitride based semiconductor layer overlying a substrate of a dissimilar material is grown. A trench is formed in the first gallium nitride based semiconductor layer. A material is deposited on a surface of the first gallium nitride based semiconductor layer to prevent a second gallium nitride based semiconductor layer, of a material different from the first gallium nitride based semiconductor layer, from nucleating thereon. The bottom surface of the trench is of a material such that the second gallium nitride based semiconductor layer will not nucleate thereon. The second gallium nitride based semiconductor material is grown, extending from at least one of the side walls of the trench, the second gallium nitride based semiconductor material having fewer defects than the first gallium nitride based semiconductor layer.

16 Claims, 4 Drawing Sheets

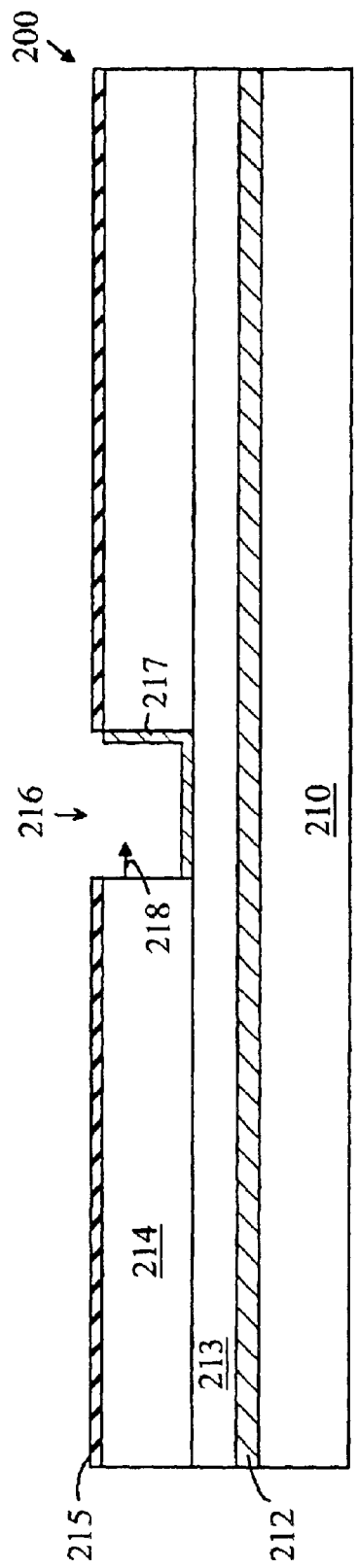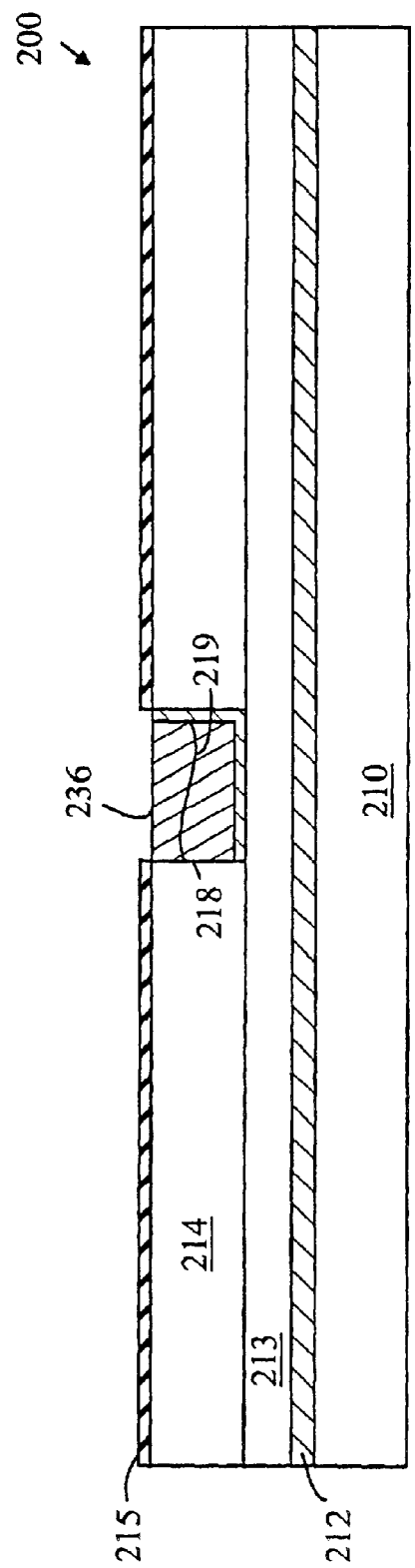

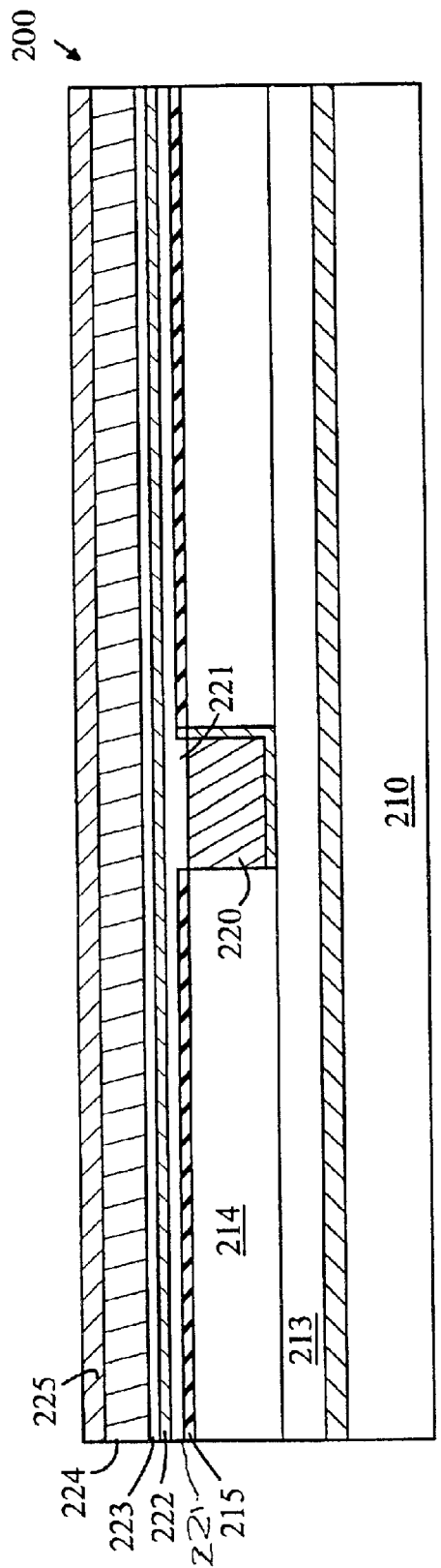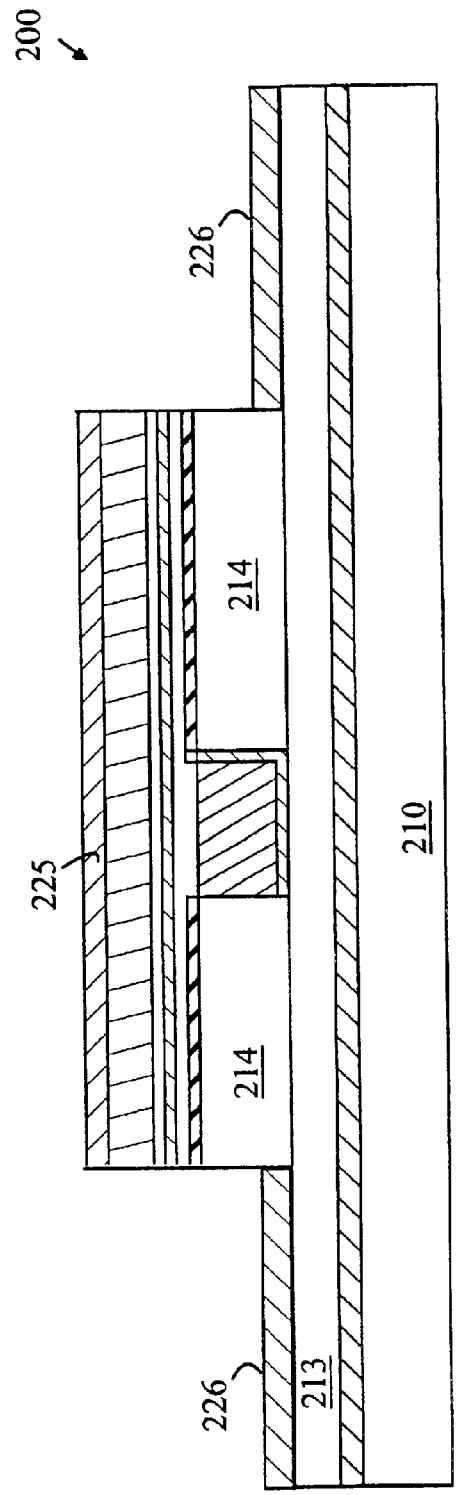

GROWING A LOW DEFECT GALLIUM NITRIDE BASED SEMICONDUCTOR

CROSS REFERENCE TO RELATED APPLICATIONS

This application is a continuation of patent application Ser. No. 09/263,654, filed Mar. 5, 1999, now U.S. Pat. No. 6,327,288 entitled "Buried Heterostructure For Lasers And Light Emitting Diodes," having Shih-Yuan Wang and Yong Chen as inventors. This application is assigned to LumiLeds Lighting, U.S., LLC, the assignee of the present invention, and is hereby incorporated by reference in its entirety and for all purposes.

FIELD OF THE INVENTION

The present invention relates to semiconductor laser diodes and more particularly relates to edge-emitting semiconductor lasers.

BACKGROUND OF THE INVENTION

Blue laser diodes (LDs) have the potential for increasing the storage capacity of optical disks over the densities currently available in compact disk systems based on red laser diodes. Increased storage capacity will open new markets for compact disks in motion picture distribution.

One class of blue emitting elements is based on group III–V nitride films such as GaN epilayers grown on sapphire substrates. To fabricate a laser, a ridge structure is constructed to provide an appropriate optical cavity having parallel mirrors at each end of the cavity. The laser cavity is typically formed by sandwiching an active gain layer between two layers of GaN doped to form n-type and p-type semiconductors. The GaN layers are constructed so as to form a waveguide by depositing the various layers and then etching the stack to form a ridge structure whose vertical walls provide the waveguide. The ends of the waveguide are mirrors that reflect the light generated in the active region back and forth. In GaN based LDs the mirrors are typically formed by cleaving or etching the ends of the waveguide to provide the reflecting surface of the mirror.

The ridge structure discussed above has two problems. First, the structure has poor heat dissipation. The heat generated in the active region must either be dissipated through the substrate or the walls of the ridge structure. The path to the substrate is restricted by the width of the ridge structure; hence, removing heat by transferring the heat to the substrate, which is typically in thermal contact with a heat sink, is difficult.

The second problem with ridge structured devices is the high voltages needed to operate the devices. The p-contact is typically an ohmic contact on the top of the ridge. The resistance of this contact must be overcome to drive the device. To reduce this resistance, the contact needs to have as large an area as possible. However, the available area is limited by the area on the top of the ridge.

Broadly, it is the object of the present invention to provide an improved edge emitting laser diode.

It is a further object of the present invention to provide an edge emitting diode that does not utilize a ridge structure, and hence, avoids the above-described problems.

These and other objects of the present invention will become apparent to those skilled in the art from the following detailed description of the invention and the accompanying drawings.

SUMMARY OF THE INVENTION

A gallium nitride based semiconductor material, and method for its production, that has fewer defects than an underlying gallium nitride based semiconductor material is disclosed. This invention includes the steps of forming a first gallium nitride based semiconductor layer overlying a substrate of a dissimilar material, the first gallium nitride based semiconductor layer having defects due to a lattice mismatch between the substrate and the first gallium nitride based semiconductor layer, forming a trench in the first gallium nitride based semiconductor layer, the trench having a bottom surface and side walls, depositing a first material on a surface of the first gallium nitride based semiconductor layer to prevent a second gallium nitride based semiconductor layer from nucleating on the surface of the first gallium nitride based semiconductor layer, and growing the second gallium nitride based semiconductor layer, of a material different from the first gallium nitride based semiconductor layer, extending from at least one of the side walls, a bottom surface of the trench being of a material such that the second gallium nitride based semiconductor layer will not nucleate thereon, the second gallium nitride based semiconductor layer having fewer defects than the first gallium nitride based semiconductor layer.

BRIEF DESCRIPTION OF THE DRAWINGS

FIGS. 3–6 are cross-sectional views through a GaN-based laser according to the present invention at various stages in the fabrication process.

DETAILED DESCRIPTION OF THE INVENTION

Figure 2:
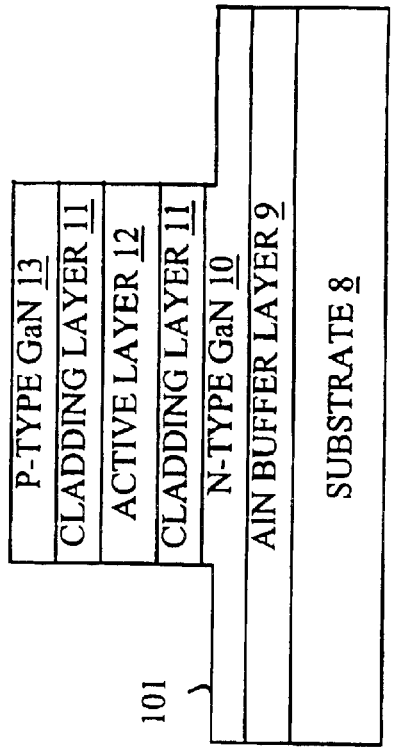
FIGS. 1 and 2 are cross-sectional views of a typical prior art laser diode at two different stages in the fabrication thereof.
Figure 1:
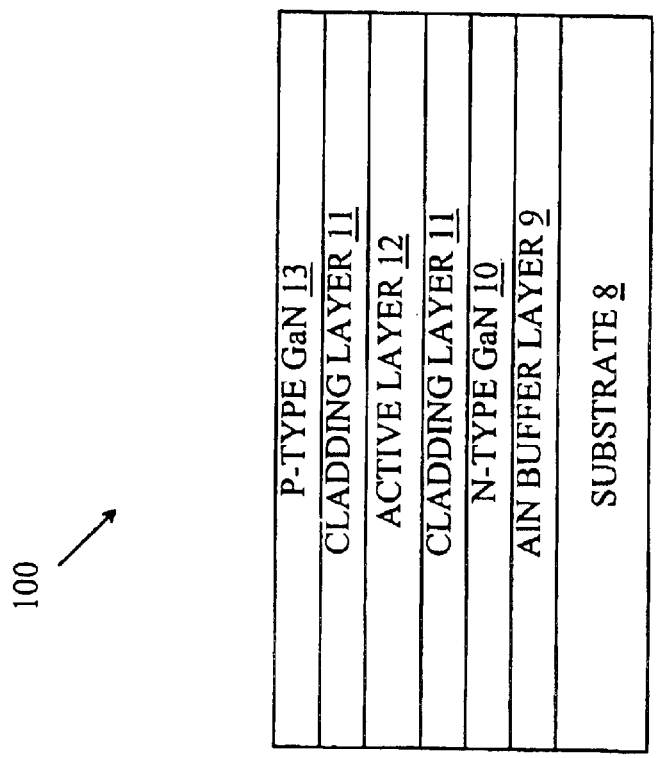

The present invention may be more easily understood with reference to FIGS. 1 and 2, which illustrate the fabrication of a typical prior art laser diode 100. Refer now to FIG. 1 which is a cross-sectional view of the layers deposited on a sapphire substrate 8 as the first step in fabricating a LD 100. An AlN layer is deposited by metal-organic chemical vapor deposition (MOCVD). AlN is preferred as the buffer material because a flat film consisting of a GaN single crystal is easily formed on an AlN layer.

After depositing the AlN buffer layer 9, a layer 10 of n-type GaN is deposited. The light-emitting part of the layer composed of GaN based cladding layers 11 and a GaN based active layer 12, and a p-type GaN layer 13 are deposited on layer 10. The cladding layers form the top and bottom walls of the laser waveguide. Referring to FIG. 2, the layers are then etched to create the side walls of the waveguide and to expose the n-type contact as shown at 101. The exposed area is used to make a connection that becomes the cathode terminal of the LD. The positive terminal is deposited on p-type layer 13. As pointed out above, the limited area available for the p-type contact imposes a minimum resistance on the contact, which, in turn, increases the operating voltage of the device.

The present invention avoids the need for a ridge structure that defines the light guide by burying a portion of the laser in a trench that is cut in a material having a substantially different index of refraction than the material from which the active region is fabricated. The portion of the device in the trench provides a side waveguide whose influence extends beyond the trench to provide the necessary containment of the light. In addition, the trench structure of the present invention provides a means for growing GaN layers that have a very low level of defects thereby providing additional benefits. Finally, the trench design of the present invention provides a self-aligning fabrication system with only one critical mask step.

The manner in which the present invention gains its advantages can be more easily understood with reference to FIGS. 3–6, which are cross-sectional views through a GaN-based laser 200 according to the present invention at various stages in the fabrication process. Refer first to FIG. 3. Laser 200 is fabricated on a sapphire substrate 210 on which a buffer layer 212 of AlN and a base layer 213 of GaN have been epitaxially grown. A layer of AlGaN is grown on top of layer 213 as shown at 214 and a trench 216 is etched in layer 214. The etching of trench 216 is the only precision masking step in the fabrication process. Trench 216 defines the location of the laser on the substrate.

As will be appreciated by those skilled in the art, there is a significant level of defects in GaN layer 213 that result from the lattice mis-match between sapphire and GaN. Even when buffer layer 212 is utilized, this level of defects degrades the performance of a laser constructed on GaN layer 213. The AlGaN layer also has an undesirable level of defects that are seeded from the defects in GaN layer 213.

One method for reducing the defect density is to epitaxially grow an additional GaN-based layer by extending an existing GaN surface over a material on which GaN will not nucleate. The present invention utilizes this technique to provide an essentially defect-free region on which the laser is fabricated. In addition, this region acts as the laser's lateral waveguide.

Referring again to FIG. 3, a layer of a material on which GaN will not nucleate is deposited on the bottom and one wall of trench 216 as shown at 217. The preferred material is also an electrical conductor for reasons that will be discussed in detail below. In the preferred embodiment of the present invention TiN is used for this purpose. The TiN layer is deposited by a conventional shadow deposition technique. In addition, a dielectric layer 215 such as $SiO_2$ is deposited on the top surface of AlGaN layer 214. It should be noted that GaN will not nucleate on SiO either.

The substrate is then placed in a deposition chamber and GaN is epitaxially grown in trench 216 by extending the wall of the trench as shown by arrow 218. Any dislocations in the material grown from the wall will be lateral. Such a dislocation is shown at 219 in FIG. 4, which is a cross-sectional view of laser 200 after the extension growth of the GaN layer. The top surface 236 of the GaN layer is essentially defect free. Hence, any new layers grown seeded from this surface will also be substantially defect free. In addition, any layers grown from this layer that extend out over the $SiO_2$ layer will also be substantially defect free, since GaN will not nucleate on $SiO_2$.

Refer now to FIG. 5, after growing GaN layer 220 by extending the wall of the trench, the additional layers needed to complete the laser are grown. The first layer is an n-type cladding layer 221 consisting of an n-AlGaN sub-layer and a n-GaN sub-layer that are grown on the top surface of 236 of GaN in the trench. To simplify the drawing, the individual sub-layers making up the cladding layers are shown as a single layer. The cladding layer is grown out over the $SiO_2$ layer 215. The active layer 222 is then grown over the cladding layer. A p-type cladding layer 223 consisting of a p-GaN sub-layer and a p-AlGaN sub-layer is then grown over the active layer. A p-GaN layer 224 is then grown over the p-cladding layer. Finally, a p-ohmic contact layer 225 is deposited on layer 224.

After the various layers discussed above have been deposited, the stack is etched back to GaN layer 213 using standard photolithographic techniques for masking. Either wet chemical etching or reactive ion etching is used for this etching operation. The n-ohmic contacts 226 are then deposited as shown in FIG. 6.

As noted above, the material used to coat the walls of trench 216 is preferably an electrical conductor. While the device will still operate if an insulator is utilized, such embodiments may suffer from current crowding along the wall of the trench that is not insulated. Hence, a conductor is preferred.

It should also be noted that the $SiO_2$ layer 215 provides current confinement for the device. Hence, the device does not need to be etched to provide the current confinement. As a result, a larger p-contact may be utilized, thereby reducing the resistance of the p-contact. As noted above, p-contact resistance is a significant problem in prior art devices.

It should also be noted that the difference in index of refraction between the material in the trench 220 and the surrounding layer 214 from which the trench is etched provides the light guiding normally provided by the edges of conventional ridge-structure. A difference in index of refraction of 1% or greater will provide the necessary light guide even though a significant portion of the device is constructed outside of the trench. The material in the trench must have an index of refraction that is greater than that of the material in which the trench is cut. Accordingly, a much larger ridge structure can be utilized. Hence, the area available for the p-contact is further enhanced relative to prior art devices.

A laser according to the present invention does not require any critical mask alignment operations during the fabrication process. The position of the trench mask determines the position of the laser on the die. The alignment of the final stack etch mask relative to the trench is not critical. The edges left by the stack etch no longer act as a wave guide, and hence, the positions of these etches relative to the trench are not critical provided there is sufficient distance between the trench and the edges to allow the light guiding provided by the trench to dominate the light guiding process.

Figure 7:
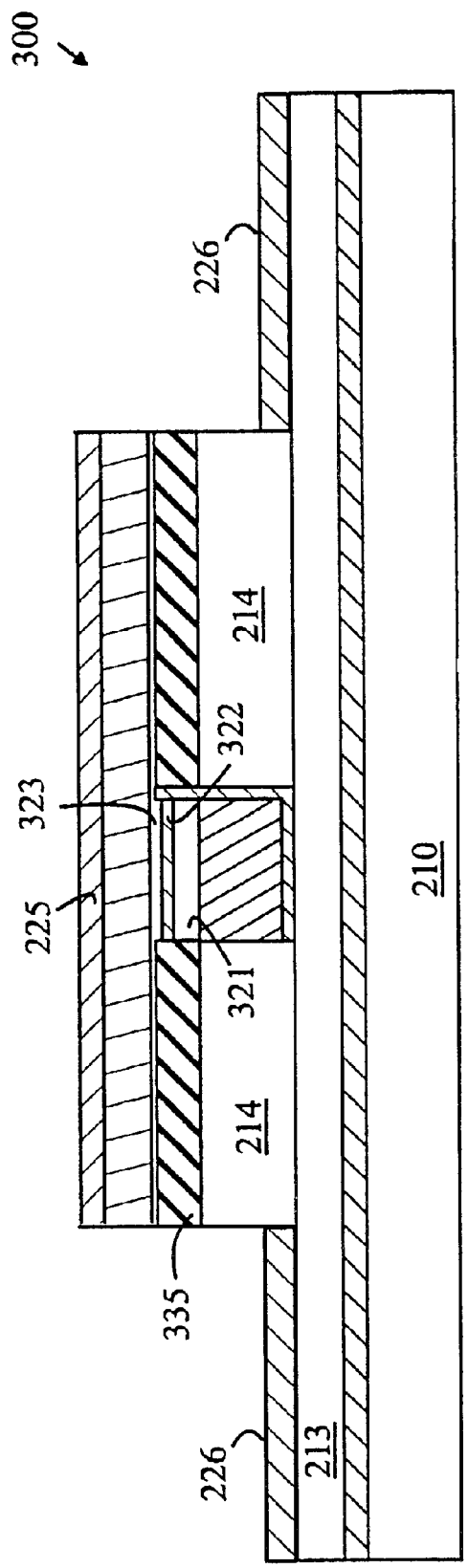
FIG. 7 is a cross-sectional view of a laser diode according to the present invention in which the active layer is confined by the trench used to form the waveguide.

The above-described embodiments of the present invention had only a portion of the n-cladding layer in the trench itself. However, embodiments of the present invention in which other layers are confined in the trench may be constructed by increasing the thickness of the $SiO_2$ dielectric layer such that these layers are confined by the sides of the dielectric layer. Such an embodiment is shown in FIG. 7, which is a cross-sectional view of a laser 300 according to another embodiment of the present invention. Laser 300 differs from laser 200 in that a much thicker dielectric layer 335 is used in place of layer 215. This thicker layer allows the entire n-cladding layer 321, the active layer 322, and a portion of the p-cladding layer 323 to be grown in the trench. The remaining layers and fabrication steps are the same as discussed above with reference to laser 200. Those layers that serve the same function as the layers shown in FIGS. 3–6 have been given the same numeric designations in FIG. 7. By constructing a greater portion of the layers in the trench, stronger light guiding is provided by the trench. It should be noted that device 300 can also be constructed by depositing the dielectric layer 215 shown in FIGS. 3–6 such that the dielectric layer overlaps the upper part of trench 218 on both sidewalls. This embodiment does not require a thick dielectric layer, since the dielectric in the upper part of the trench is provided by the overlap.

The above-described embodiments of the present invention utilized an n-GaN layer in the trench. However, it will be obvious to those skilled in the art from the preceding discussion that embodiments in which the p-type layers are deposited in a trench in a p-type material having a different index of refraction from the layers grown in the trench may also be constructed.

Furthermore, the method of the present invention may also be applied to laser diodes constructed from other material systems. While other material systems may not benefit from all of the advantages of the present invention, the lack of critical masking steps will provide a significant benefit in other laser diode systems.

Various modifications to the present invention will become apparent to those skilled in the art from the foregoing description and accompanying drawings. Accordingly, the present invention is to be limited solely by the scope of the following claims.

What is claimed is:

1. A method for growing a gallium nitride based semiconductor material overlying a substrate of a dissimilar material, comprising:

forming a first gallium nitride based semiconductor layer overlying said substrate, said first gallium nitride based semiconductor layer having defects due to a lattice mis-match between said substrate and said first gallium nitride based semiconductor layer;

forming a trench in said first gallium nitride based semiconductor layer, said trench having a bottom surface and side walls;

depositing a first material on a surface of said first gallium nitride based semiconductor layer to prevent a second gallium nitride based semiconductor layer from nucleating on said surface of said first gallium nitride based semiconductor layer; and growing said second gallium nitride based semiconductor layer, of a material different from said first gallium nitride based semiconductor layer, extending tom at least one of said side walls, a bottom surface of said trench being of a material such that said second gallium nitride based semiconductor layer will not nucleate thereon, said second gallium nitride based semiconductor layer having fewer defects than said first gallium nitride based semiconductor layer.

2. The method of claim 1 wherein at least one additional layer is formed between said first gallium nitride based semiconductor layer and said substrate.

3. The method of claim 1 further comprising depositing a second material to prevent said second gallium nitride based semiconductor layer from growing on said bottom surface of said trench.

4. The method of claim 3 wherein said second material is an electrical conductor.

5. The method of claim 4 wherein said second material is titanium nitride.

6. The method of claim 1 further comprising depositing material to prevent gallium nitride from growing on one of said side walls of said trench.

7. The method of claim 1 wherein said forming a trench is conducted before said depositing.

8. The method of claim 1 wherein said trench extends all the way through said first gallium nitride based semiconductor layer.

9. The method of claim 1 wherein said first gallium nitride, based semiconductor layer is aluminum gallium nitride and said second gallium nitride based semiconductor layer is gallium nitride.

10. The method of claim 1 wherein said first material is silicon dioxide.

11. The method of claim 1 wherein said first material is deposited on a top surface of said fist gallium nitride based semiconductor layer.

12. The method of claim 1 further comprising depositing additional layers overlying said second gallium nitride based semiconductor material, wherein at least one of said additional layers is a first cladding layer.

13. The method of claim 12 wherein at least one of said additional layers is an active layer overlying said cladding layer.

14. The method of claim 13 wherein at least one of said additional layers is a second cladding layer overlying said active layer.

15. The method of claim 1 further comprising depositing additional layer overlying said second gallium nitride based semiconductor material, wherein at least one of said additional layers is an active layer for emitting light.

16. The method of claim 1 wherein said first material overlaps at least a portion of at least one of said side walls.

* * * * *

UNITED STATES PATENT AND TRADEMARK OFFICE
CERTIFICATE OF CORRECTION

PATENT NO. : 6,849,474 B2
DATED : February 1, 2005
INVENTOR(S) : Shih-Yuan Wang and Yong Chen It is certified that error appears in the above-identified patent and that said Letters Patent is hereby corrected as shown below:

Column 5,
Line 37, cancel "tom" and substitute -- from --.

Column 6,
Line 18, cancel "nitride," and substitute -- nitride --.
Line 24, cancel "fist" and substitute -- first --.
Line 37, cancel "layer" and substitute -- layers --.

Signed and Sealed this

Twenty-fourth Day of May, 2005

JON W. DUDAS
*Director of the United States Patent and Trademark Office*